(12) United States Patent
Zhu et al.

(10) Patent No.: US 8,749,307 B2
(45) Date of Patent: Jun. 10, 2014

(54) APPARATUS AND METHOD FOR A TUNABLE MULTI-MODE MULTI-BAND POWER AMPLIFIER MODULE

(75) Inventors: Xu Zhu, Allen, TX (US); Michael Brobston, Allen, TX (US); Lup M. Loh, Plano, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 111 days.

(21) Appl. No.: 13/219,231

(22) Filed: Aug. 26, 2011

(65) Prior Publication Data

US 2012/0056677 A1 Mar. 8, 2012

Related U.S. Application Data

(60) Provisional application No. 61/379,695, filed on Sep. 2, 2010.

(51) Int. Cl.
*H03G 3/20* (2006.01)
*H03F 1/14* (2006.01)

(52) U.S. Cl.
CPC ........................................ *H03F 1/14* (2013.01)
USPC .............................................. 330/129; 330/51

(58) Field of Classification Search
CPC .......................................................... H03F 1/14
USPC ................................. 330/51, 124 R, 129, 136
See application file for complete search history.

(56) References Cited

U.S. PATENT DOCUMENTS

| 7,183,844 B2 * | 2/2007 | Klomsdorf et al. ............ 330/129 |
| 7,602,243 B2 * | 10/2009 | Murao ........................... 330/136 |
| 8,131,232 B2 * | 3/2012 | Muhammad ................ 455/114.2 |
| 2010/0308933 A1 * | 12/2010 | See et al. ......................... 333/32 |

* cited by examiner

*Primary Examiner* — Robert Pascal
*Assistant Examiner* — Khiem Nguyen (57) ABSTRACT

An apparatus and method amplify a signal for use in a wireless network. The apparatus includes a power amplifier, an envelope modulator, a tunable matching network (TMN), and a controller. The power amplifier outputs the signal at an output power. The envelope modulator controls a bias setting for the power amplifier. The TMN includes a plurality of immittance elements. The controller is operably connected the envelope modulator and the TMN. The controller identifies a desired value for the output power of the power amplifier, controls the output power of the power amplifier by modifying the bias setting of the power amplifier, and sets a number of the plurality of immittance elements based on the bias setting of the power amplifier.

20 Claims, 10 Drawing Sheets

APPARATUS AND METHOD FOR A TUNABLE MULTI-MODE MULTI-BAND POWER AMPLIFIER MODULE

CROSS-REFERENCE TO RELATED APPLICATION(S) AND CLAIM OF PRIORITY

The present application is related to U.S. Provisional Patent Application No. 61/379,695, filed Sep. 2, 2010, entitled "SMART TUNABLE MULTI MODE MULTI BAND POWER AMPLIFIER MODULE". Provisional Patent Application No. 61/379,695 is assigned to the assignee of the present application and is hereby incorporated by reference into the present application as if fully set forth herein. The present application hereby claims priority under 35 U.S.C. §119(e) to U.S. Provisional Patent Application No. 61/379,695.

The present application is also related to U.S. patent application Ser. No. 13/214,892, filed on Aug. 22, 2011, and entitled "APPARATUS AND METHOD FOR CONTROLLING A TUNABLE MATCHING NETWORK IN A WIRELESS NETWORK". U.S. patent application Ser. No. 13/214,892 is assigned to the assignee of the present application and is hereby incorporated by reference into the present application as if fully set forth herein.

TECHNICAL FIELD OF THE INVENTION

The present application relates generally to signal amplification in a wireless network and, more specifically, to a tunable multi-mode and multi-band power amplifier module.

BACKGROUND OF THE INVENTION

Wireless handsets are increasingly required to operate in multiple modes (e.g. Global System for Mobile Communications (GSM) general packet radio service GPRS, enhanced data rates for GSM Evolution (EDGE), code division multiple access (CDMA), wideband CDMA (WCDMA) high-speed uplink packet access (HSUPA), long term evolution (LTE). Wireless handsets are also increasingly required to operate in multiple frequency bands (e.g. 700, 800, 900, 1700, 1800, 1900, 2100, and 2600 MHz bands).

Multi-mode and multi-band wireless handsets typically contain a separate dedicated power amplifier (PA) for each individual mode and band of operation. For example, a quad-band GSM and tri-band WCDMA handset will often have one GSM power amplifier covering digital cellular service (DCS) and personal communications service (PCS) bands, one GSM power amplifier covering United States cellular and European cellular bands, one WCDMA power amplifier for United States cellular band, one WCDMA power amplifier for PCS band, and one WCDMA power amplifier for International Mobile Telecommunications-2000 (IMT-2000) band. Often the two GSM band power amplifiers will be packaged into a single power amplifier module, yet these modules typically contain two separate power amplifier circuits, one for the higher bands and another for the lower bands. Having five complete discrete power amplifier circuits as in this example has a significant size and cost impact on the overall wireless handset design.

Wireless handsets use dedicated power amplifier circuits for each band and mode to optimize input and output matches to achieve the best linearity and/or efficiency for the given mode or band of operation. Although the main transistor of the amplifier circuit is broadband, the bandwidth of the amplifier circuit is typically made narrower by the input and output matching circuits. Therefore, to achieve acceptable linearity and efficiency, often power amplifier circuits using fixed matching networks tuned for the different bands and modes of operation are used in a wireless terminal. Using fixed matching networks, a semiconductor power transistor device can only efficiently transmit RF signals in a single mode and a single band.

While some power amplifiers may be operated in two modes which have similar bands, compromises are often made for one mode or both modes due to different modulation schemes. Further, the GSM and CDMA modes present challenges because the GSM system the power amplifier transistor operates in saturated region, whereas in CDMA the transistor has to operate at a more linear region in continuous time. The different operations lead to very different impedance matching solutions at the output of a PA. In a fixed impedance system design, such as commonly used 50 ohm system, a fixed matching network cannot satisfy both modes simultaneously.

In terms of frequency coverage, a single power amplifier circuit typically can only cover either a low band (e.g. 800-900 MHz), or a high band (e.g. 1700-1900 MHz), or a Universal Mobile Telecommunications System (UMTS) band (2100 MHz). Again, the load impedance presented at the output of the power amplifier transistor can be quite different at various operating frequencies. Thus, a single fixed matching network cannot usually provide optimum matching for all potential frequency bands simultaneously. Therefore, multiple PAs are often required in a multi-mode multi-band wireless handset.

The ever decreasing form factor and ever increasing functionality demanded of wireless terminals creates conflicting challenges on front-end devices like number of PAs that can be installed. Currently, board space constrains limits the number of PAs on even the most complicated handset units. Despite much effort within the industry to aggressively reduce device sizes, the fundamental physics and fabrication challenges prohibit the device size shrink to keep pace with the number of added functions within the wireless handset. Not only do additional PA devices cost more board space, the peripheral passive components around each PA device also occupy board space and increase proportionately with the number of PAs used.

Many solutions have been used to improve PA performance and efficiency therefore battery life. For example, PA modules may implement as Envelope Modulation/Envelope Tracking, bias modulation, and Digital Pre-distortion. Also, the wireless networks utilize closed-loop power management schemes to adjust wireless handset PA output levels in order to reduce potential interference and save wireless handset power. All these solutions change the output characteristics of a PA. However, fixed matching networks may prevent full utilization of these solutions.

Therefore, there is a need in the art for an improved power amplifier module. In particular, there is a need for a power amplifier module that is capable of amplifying multiple modes and multiple bands at multiple power output levels.

SUMMARY OF THE INVENTION

Exemplary embodiments of the present disclosure provide an apparatus for amplifying a signal for use in a wireless network. The apparatus includes a power amplifier, an envelope modulator, a tunable matching network (TMN), and a controller. The power amplifier outputs the signal at an output power. The envelope modulator controls a bias setting for the power amplifier. The TMN includes a plurality of immittance elements. The controller is operably connected the envelope modulator and the TMN. The controller identifies a desired value for the output power of the power amplifier, modifies the bias setting of the power amplifier based on the desired output power level, and sets a number of the plurality of immittance elements based on the bias setting of the power amplifier.

In another exemplary embodiment, a method for amplifying a signal for use in a wireless network is provided. The signal is output by a power amplifier at an output power. A desired value for the output power of the power amplifier is identified. A bias setting of the power amplifier is modified to control the output power of the power amplifier. A number of a plurality of immittance elements are set in a tunable matching network (TMN) operably connected the power amplifier based on the bias setting of the power amplifier.

In yet another exemplary embodiment, a power amplifier module for amplifying a signal in a mobile station is provided. The amplifier module includes a first power amplifier, a first tunable matching network (TMN), a second TMN, an envelope modulator, a switch, a storage device, and a controller. The first power amplifier amplifies the signal. The second power amplifier outputs the signal at an output power. The first TMN is operably connected to an output of the first power amplifier and an input of the second power amplifier. The second TMN operably connected to an output of the second power amplifier. The envelope modulator controls a bias setting for the second power amplifier. The switch is positioned on a path between the input and the output of the second power amplifier. The storage device stores a plurality of bias settings of the second power amplifier and a plurality of settings for the first TMN and the second TMN. The controller is operably connected to the envelope modulator, the first and second TMNs, the switch, and the storage device. The controller identifies a desired value for the output power of the second power amplifier, identifies the bias setting and the settings for the first TMN and the second TMN from the storage device based on the desired value for the output power, modifies the bias setting of the power amplifier based on the desired output power level, and sets a number of immittance elements in the first and second TMN based on the bias setting.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged mobile station.

Figure 1:
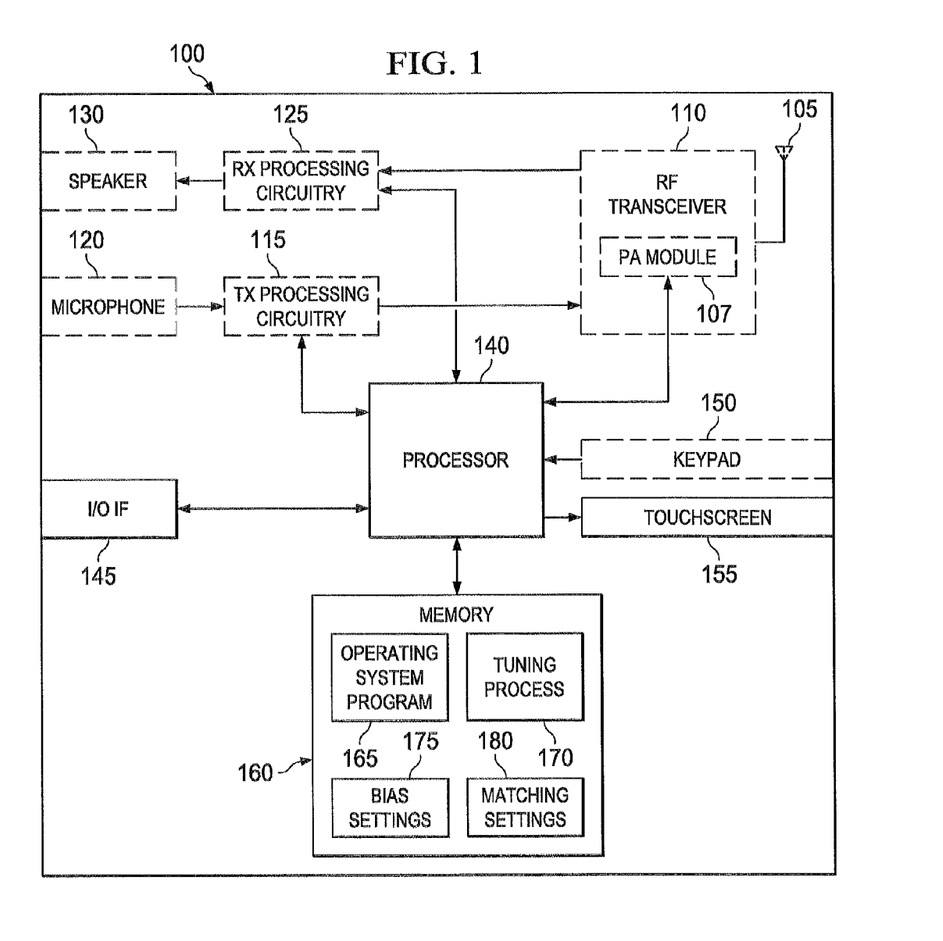
FIG. 1 illustrates a wireless mobile station according to the present disclosure.

FIG. 1 illustrates a wireless mobile station according to the present disclosure. Mobile station 100 comprises antenna 105, PA module 107, radio frequency (RF) transceiver 110, transmit (TX) processing circuitry 115, microphone 120, and receive (RX) processing circuitry 125. Mobile station 100 also comprises speaker 130, processor 140, input/output (I/O) interface (IF) 145, keypad 150, touchscreen 155, and memory 160. Memory 160 further comprises basic operating system process 165, tuning process 170, bias settings 175, and matching settings 180. In these examples, mobile station 100 is a mobile device that can send and receive signals over a wireless network. For example, without limitation, mobile station 100 may be a handset, a mobile phone, a portable digital assistant, a laptop computer, a tablet computer, an electronic reader, and/or any other suitable mobile device.

Radio frequency transceiver 110 receives from antenna 105 an incoming RF signal transmitted by a base station to the mobile station 100. Radio frequency transceiver 110 downconverts the incoming RF signal to produce an intermediate frequency (IF) or a baseband signal. The IF or baseband signal is sent to receiver (RX) processing circuitry 125, which produces a processed baseband signal by filtering, digitizing the baseband or IF signal, additional filtering, if necessary, demodulation and/or decoding. Receiver (RX) processing circuitry 125 transmits the processed baseband signal to speaker 130 (i.e., voice data) or to processor 140 for further processing (e.g., web browsing).

Transmitter (TX) processing circuitry 115 receives analog or digital voice data from microphone 120 or other outgoing baseband data (e.g., web data, e-mail, interactive video game data) from processor 140. Transmitter processing circuitry 115 encodes, modulates, multiplexes, and/or digitizes the outgoing baseband data to produce a processed baseband or IF signal. Radio frequency transceiver 110 receives the outgoing processed baseband or IF signal from transmitter processing circuitry 115. Radio frequency transceiver 110 up-converts the baseband or IF signal to a radio frequency signal that is transmitted via antenna 105.

In an exemplary embodiment of the present disclosure, processor 140 is a microprocessor or microcontroller. Memory 160 is coupled to processor 140. According to an advantageous embodiment of the present disclosure, part of memory 160 comprises a random access memory (RAM) and another part of memory 160 comprises a non-volatile memory, such as Flash memory, which acts as a read-only memory (ROM).

Processor 140 executes basic operating system (OS) program 165 stored in memory 160 in order to control the overall operation of mobile station 100. In one such operation, processor 140 controls the reception of forward channel signals and the transmission of reverse channel signals by radio frequency transceiver 110, receiver processing circuitry 125, and transmitter processing circuitry 115, in accordance with well-known principles.

Processor 140 is capable of executing other processes and programs resident in memory 160. Processor 140 can move data into or out of memory 160, as required by an executing process. Processor 140 is also coupled to input/output (I/O) interface 145. I/O interface 145 provides mobile station 100 with the ability to connect to other devices such as laptop computers and handheld computers. I/O interface 145 is the communication path between these accessories and processor 140.

Processor 140 is also coupled to keypad 150 and touch-screen 155. The operator of mobile station 100 uses keypad 150 to enter data into mobile station 100. Touchscreen 155 may be a liquid crystal display capable of rendering text and/or at least limited graphics from web sites. Alternate embodiments may use other types of displays.

In this exemplary embodiment, mobile station 100 includes PA module 107. PA module 107 amplifies signals transmitted by RF transceiver 110. PA module 107 is capable of operating at multiple bands and in multiple modes while meeting performance parameters. PA module 107 is also capable of outputting at different power levels while meeting performance parameters. PA module 107 includes one or more tunable matching networks (TMN) for managing impedance values to meet the performance parameters of PA module 107. For example, PA module 107 may have performance parameters to meet an efficiency target, a linearity target, an operating frequency for the signal, a bias class, an output power level, a noise figure, and/or again target. Examples of components that may be present in a PA module may be found in U.S. patent application Ser. No. 12/288,030, entitled "APPARATUS AND METHOD FOR AN INTEGRATED MULTI-MODE MULTI-BAND POWER AMPLIFIER," assigned to the assignee of the present application and incorporated herein by reference.

In this example, processor 140 controls PA module 107 by modifying control variables of PA module 107 to manage impedance values. For example, processor 140 may process instructions from tuning process 170 to control PA module 107 based on values detected within PA module 107. Additionally, tuning process 170 may configure PA module 107 for operation in different modes, operation bands, and/or output power levels. Tuning process 170 configures and adjusts control variables in PA module 107 based on bias settings 175 stored in memory 160. Bias settings 175 include values a supply voltage of PA module 107 for controlling the output power.

In these examples, tuning process 170 also utilizes matching settings 180 to manage impedance values in PA module 107 to meet the performance parameters. Matching settings 180 are settings for control variables of the TMN(s) in PA module 107. For example, matching settings 180 may include at least one matching setting for each bias setting in bias settings 175.

While the description describes that certain embodiments of the present disclosure may be implemented in mobile stations or handsets, the various embodiments of the present disclosure may also be implemented in any suitably arranged base station and/or relay station.

Figure 2:
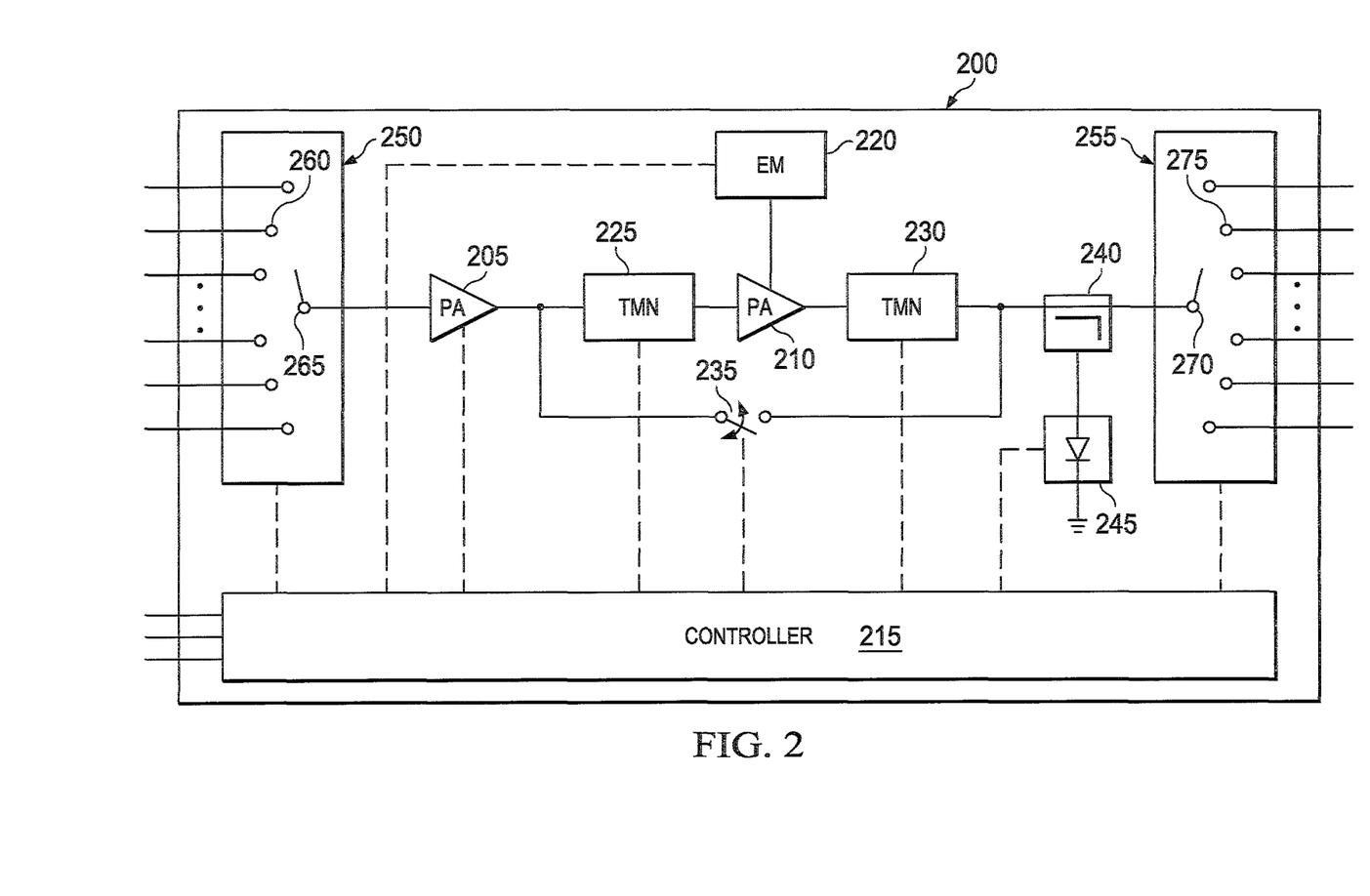
FIG. 2 illustrates a tunable power amplifier module according to the present disclosure.

FIG. 2 illustrates a tunable power amplifier module according to the present disclosure. In this illustrative example, PA module 200 includes PAs 205 and 210, controller 215, envelope modulator (EM) 220, TMNs 225 and 230, bypass switch 235, sensor 240, detector circuit 245, first interface 250, and second interface 255. PA module 200 is an example of one implementation of PA module 107 in FIG. 1.

PA module 200 amplifies a signal to be transmitted over a wireless network. Signals to be transmitted are received at first interface 250. First interface 250 has plurality of input terminals 260 and single pole output terminal 265. In one example, the first interface 250 is a Single Pole Multi Throw switch (SPnT) enabled by Micro-Electro-Mechanical System (MEMS) technology, and/or semiconductor technology.

Signals to be transmitted are amplified by PA 205. PA 205 is a broadband PA. PA 205 provides a low power amplification of the input signal. PA 205 is a first stage of amplification of the signal. The broadband PA 205 outputs the low power amplified signal via an output terminal.

The signal output form PA 205 is received by TMN 225. In this illustrative example, TMNs 225 and 230 include a number of tunable and fixed immittance elements. For example, the immittance elements may include, for example, without limitation, fixed or tunable capacitors, inductors, MEMS capacitors or switches, ferro- or para-electric capacitors, silicon on insulator CMOS switches, varactor diode capacitors. These immittance elements may be controlled or switched to be placed in parallel or series with PA 210 to adjust the impedance before or after amplification of the signal. TMNs 225 and 230 have multiple control variables for impedance matching. Each control variable controls the tuning or switching of one or more immittance elements. The control variables are controlled by controller 215. Examples of various configurations for tunable matching networks may be found in U.S. Pat. No. 7,332,980, entitled "SYSTEM AND METHOD FOR A DIGITALLY TUNABLE IMPEDANCE MATCHING NETWORK," assigned to the assignee of the present application and incorporated herein by reference.

Figure 10A:
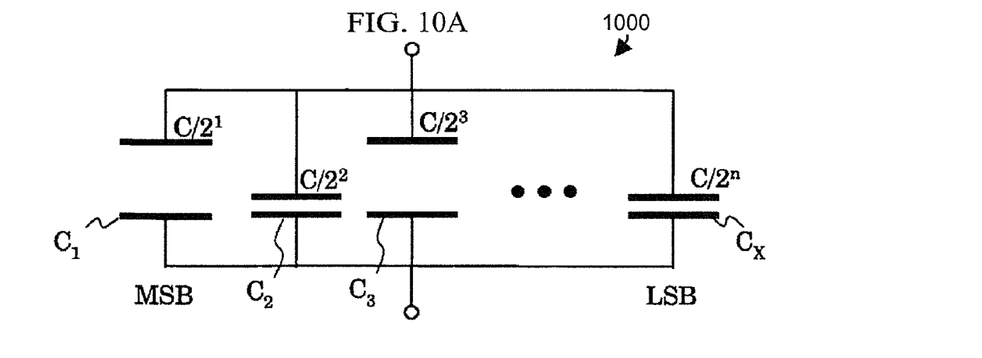
FIGS. 10A, 10B, and 10C illustrate examples of various configurations for tunable matching networks.
Figure 10B:
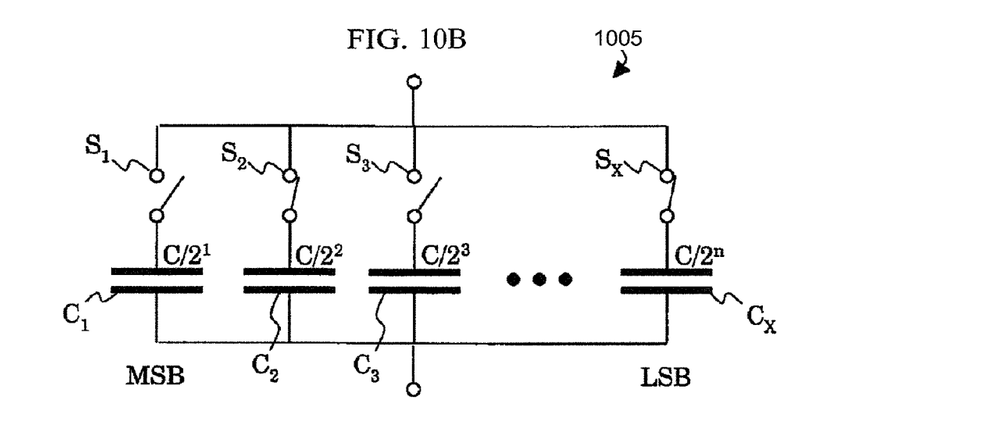
Figure 10C:
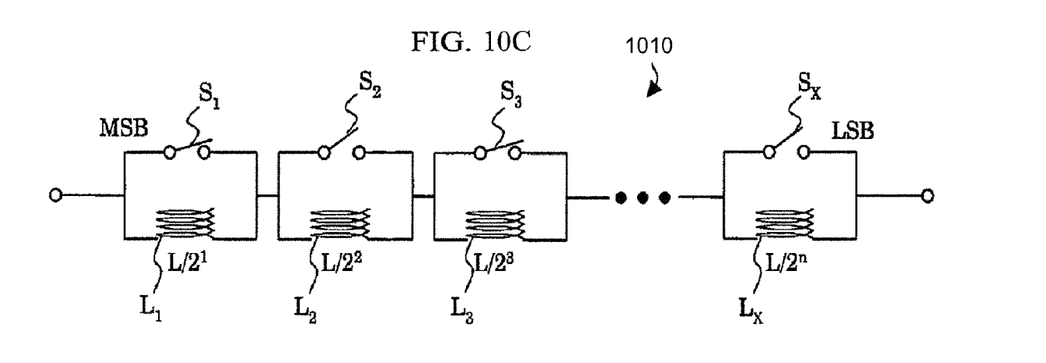

FIGS. 10A, 10B, and 10C illustrate examples of various configurations for tunable matching networks from U.S. Pat. No. 7,332,980. Referring to FIG. 10A, a circuit 1000 illustrates one embodiment of a digitally tunable matching network. In the present example, the circuit 1000 is based on digitally tunable capacitors $C_1, C_2, C_3, \ldots, C_X$ that may be either ON or OFF. Referring to FIG. 10B, a circuit 1005 illustrates another embodiment of a digitally tunable matching network. In the present example, the circuit 1005 is based on fixed capacitors $C_1, C_2, C_3, \ldots, C_X$ that may be turned either ON or OFF using corresponding switches $S_1, S_2,$ $S_3, \ldots, S_X$, respectively. Referring to FIG. 10C, a circuit 1010 illustrates yet another embodiment of a digitally tunable matching network. In the present example, the circuit 1010 is based on inductors $L_1, L_2, L_3, \ldots, L_X$ that may be turned either ON or OFF using corresponding switches $S_1, S_2, S_3, \ldots, S_X$, respectively.

PA 210 is a second stage of power amplification of the signal. PA 210 is a high power amplifier configured to provide a high power amplification of the signal. Thus, the output of the final PA 216 is a high power amplified signal.

EM 220 controls the drain or collector bias voltage of PA 210. For example, EM 220 can modify a supply voltage to a drain or collector of a transistor (not shown) of PA 210. By modifying the drain or collector bias voltage of PA 210, EM 220 can optimize the bias voltage relative to the instantaneous envelope level of the output signal of PA 210. For example, EM 220 can adjust the drain or collector voltage of PA 210 either to track the envelope variations of the transmitted waveform (Envelope Tracking (ET) Mode) or to a constant voltage base on the average power of the time-varying waveform (Bias Adaptation Mode). In these examples, EM 220 also includes an envelope tracker to track the envelope of a signal coming into PA 210. In some embodiments, EM 220 improves the efficiency of PA 210 by modulating the supply voltage to track the envelope of the signal input into PA 210. At instantaneous envelope voltages below a predetermined threshold during envelope tracking, the overall efficiency of EM 220 and PA 210 may be best optimized by operating the PA 210 drain or collector voltage at the constant threshold level, which may be implemented in some cases by means of a digital shaping function. At lower operating power conditions, the overall efficiency of EM 220 and PA 210 may be improved by operating the PA 210 drain or collector voltage at a constant level based on the target average output power to optimize the efficiency of EM 220.

PA module 200 includes detector circuit 245. Detector circuit 245 is coupled to the output of TMN 230 at a sensor 240. Detector circuit 245 is configured to detect (e.g., sense) performance parameters associated with the amplified signal, such as, but not limited to, forward power level. Detector circuit 245 provides real-time feedback of the output of PA 210. Detector circuit 245 provides the real time feedback to controller 215.

Signals amplified by PA module 200 are output by second interface 255. In this example, second interface 255 has single pole input terminal 270 and plurality of output terminals 275. In one example, the second interface 255 is a Single Pole Multi Throw switch (SPnT) enabled by Micro-Electro-Mechanical System (MEMS) technology, and/or semiconductor technology.

In this exemplary embodiment, controller 215 controls components in PA module 200 to meet performance parameters while being capable of operating in multiple bands and multiple modes. For example, controller 215 controls EM 220, TMNs 225 and 230, and bypass switch 235 to reach desired levels for the performance parameters. The present disclosure recognizes that it may be desirable for PA module 200 to output signals with different levels of output power. Controller 215 utilizes a power management scheme to adjust the drain bias and input and output matching conditions for optimum efficiency and linearity at the target output power level. For example, the output power may be modified to reduce potential interference and save wireless handset power based on a proximity to a base station.

To optimize the efficiency and linearity for a target output power level, controller 215 further controls the bias settings of PA 210 and the settings for TMNs 225 and 230 to meet performance parameters for PA module 200. For example, performance parameters may be met by modifying bias settings of PA 210 and the settings for TMNs 225 and 230 based on the output power level. Table 1 below provides an example of bias settings of PA 210 and the settings for TMNs 225 and 230 on the output power level for PA module 200.

TABLE 1

| OUTPUT POWER | BIAS SETTING | MATCH SETTING |
| --- | --- | --- |
| First Range | ET Mode | ET Matching |
| Second Range | Bias Adaptation | Load Line Control |
| Third Range | Fixed Bias | Load Line Control |
| Fourth Range | Bypass | Bypass |

In this example, the first range of values for the output power is a high range. In the first range, controller sets the bias setting for EM 220 to modulate the supply voltage for PA 210 to track the envelope of the signal received at PA 210. During envelope tracking (ET), TMNs 225 and 230 perform impedance matching based on the fact that the supply voltage for PA 210 is being modulated. For example, under ET bias conditions, PA 210 efficiency and linearity may be optimized using different TMN settings than under other bias conditions. Controller 215 sets the selected control variables in TMNs 225 and 230 to achieve the desired performance parameters while PA 210 is in ET mode.

ET is utilized in PA module to improve the efficiency of PA 210 under high average power conditions by reducing the transistor bias voltage during troughs in the waveform envelope thereby reducing the amount of power dissipated in the transistor of PA 210. However, as the output power decreases, the efficiency of EM 220 also decreases. At some point, it becomes less efficient to operate in ET mode then to operate without envelope tracking. Thus, for the second range of power values controller 215 sets the bias setting of PA 210 to bias adaptation and TMNs 225 and 230 to load line control. During bias adaptation, EM 220 modifies the supply voltage to constant levels based on the target average output power. When the desired level for output power may change, EM 220 may change the supply voltage of PA 210. However, while the output power level is within the second range of values, EM 220 will not modulate the supply voltage for ET. TMNs 225 and 230 manage values for impedance in PA module 200 to account for the possibly varying but not modulated bias setting of PA 210.

Changing the bias of PA 210 to match the output power level for PA module 200 is effective up to the point where the supply voltage drops to the point where the transistor(s) (not shown) gain drops significantly and is no longer sufficient. For example, the transistor may require a certain minimum supply voltage to provide adequate signal gain. Thus, in the third range of values for the output power, PA 210 operates at a fixed bias. For example, the supply voltage remains constant at a fixed level without being adjusted for variations in the average target output power within this range. TMNs 225 and 230 manage values for impedance in PA module 200 based on the fixed threshold value for the bias of PA 210. Within this range the TMN 225 and 230 settings may be adjusted based on the average target output power to present the optimum load line condition to the PA 210 transistor in order to optimize its performance parameters.

Once the output power level drops below a certain value, the second stage of power amplification is no longer necessary. Controller 215 closes bypass switch 235 when the output power is in the fourth range of values. With bypass switch 235 closed, signals bypass PA 210 and TMNs 225 and 230. In bypass, PA 210 and TMNs 225 and 230 may be switched off to conserve power.

For example, without limitation, bypass switch 235 may be a semiconductor switch (GaAs, bulk CMOS, GaN, InGaP, SiGe, or other semiconductors), a silicon-on-insulator switch, a silicon-on-sapphire switch, a high-resistivity substrate switch, a ferro-electric material switch, or micro-electro-mechanical system (MEMS) switch.

In one illustrative example, the first range of power output values in TABLE 1 may include a range of power values between about 27 decibel milliwatts (dBm) to about 22 dBm; the second range of power output values in TABLE 1 may include a range of power values between about 22 dBm to about 17 dBm; the third range of power output values in TABLE 1 may include a range of power values between about 17 dBm to about 12 dBm; and the fourth range of power output values in TABLE 1 may include a range of power values less than or equal to about 12 dBm. The values for the ranges are for example only and are not meant to imply physical or architectural limitations to the manner in which different embodiments may be implemented. For example, any number of different ranges may be used for any number of different combinations of output power, operating mode, and/or operating band.

The illustration of PA module 200 is not meant to imply physical or architectural limitations to the manner in which different embodiments may be implemented. Other components in addition to and/or in place of the ones illustrated may be used. Some components may be unnecessary in some illustrative embodiments. Also, the blocks are presented to illustrate some functional components. One or more of these blocks may be combined and/or divided into different blocks when implemented in different embodiments.

For example, in some embodiments, PA 205 may include matching networks for adjusting levels of impedance for PA 205. The matching networks may be fixed or tunable by controller 215. The matching networks may be before and/or after PA 205. In some embodiments, first interface 250 and second interface 255 may be replaced by a RF tunable front end module.

Figure 3:
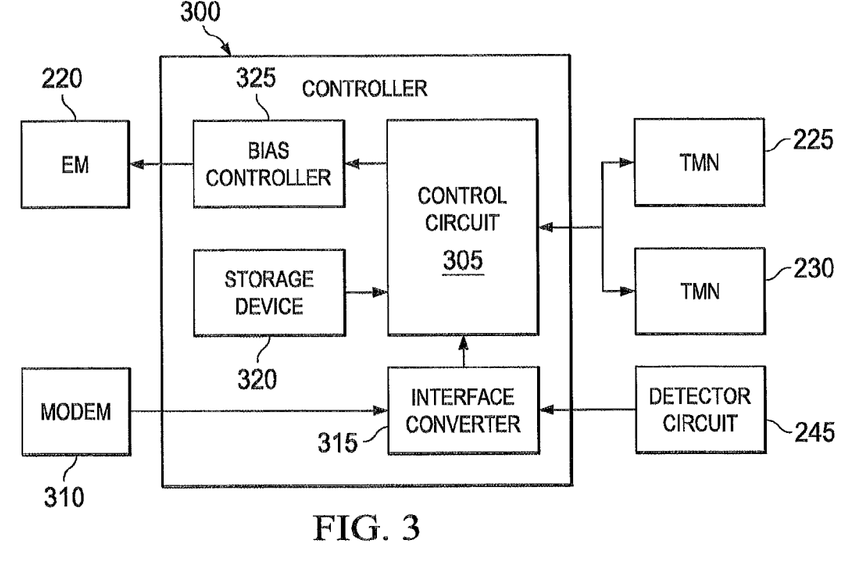
FIG. 3 illustrates a controller for a tunable power amplifier module according to the present disclosure.

FIG. 3 illustrates a controller for a tunable power amplifier module according to the present disclosure. In this illustrative embodiment, controller 300 is an example of one implementation of controller 215 in FIG. 2.

Control circuit 305 provides feedback control functions of controller 300. Control circuit 305 may be for, for example, without limitation, series of finite state machines, digital logic circuits, a programmable integrated circuit (IC), a microcontroller, application specific IC (ASIC). In some embodiments, control circuit 305 may be processor 140 in mobile station 100. FIG. 1 shows a content of the control circuit block. Control circuit 305 identifies the operating mode, operating band, and/or output power level from modem 310 via interface converter 315. Interface converter 315 converts the digital communication format or protocol of modem 310 to the format of control circuit 305.

Control circuit 305 provides control settings to EM 220 and TMNs 225 and 230 based on the operating mode, operating band, and/or output power level. Control circuit 305 retrieves the bias setting for EM 220 from storage device 320 based on the output power level. Control circuit 305 provides the bias setting to EM 220 via bias controller 325. For example, storage device 320 may include a look-up table for bias settings based on output power, such as illustrated in TABLE 1. Storage device 320 may be permanent, for example, read-only memory, reprogrammable but non-volatile memory (NVM), or volatile memory for example random access memory (RAM). In one example, storage device 320 is memory 160 in mobile station 100. In another example, storage device 320 is specific for use in controller 300.

Control circuit 305 retrieves the matching settings for TMNs 225 and 230 from storage device 320 based on the operating mode, operating band, and/or output power level. For example, storage device 320 may include a look-up table for including selections and settings control variables for immittance elements in TMNs 225 and 230 for given operating mode, operating band, and/or output power level. TMNs 225 and 230 match values of impedance to achieve certain performance parameters. The states of TMN 225 and 230 can be read by Control Circuit 325. Systems and methods for configuring and adjusting tunable matching networks for managing impedance values for a power amplifier are disclosed in U.S. patent application Ser. No. 13/214,892, entitled "APPARATUS AND METHOD FOR CONTROLLING A TUNABLE MATCHING NETWORK IN A WIRELESS NETWORK," which is assigned to the assignee of the present application and is incorporated herein by reference.

Control circuit 305 also receives feedback about performance parameters and output power from detector circuit 245 via interface converter 315. Control circuit 305 can further adjust bias settings and/or TMNs 225 and 230 to meet the performance parameters and output power.

Figure 4:
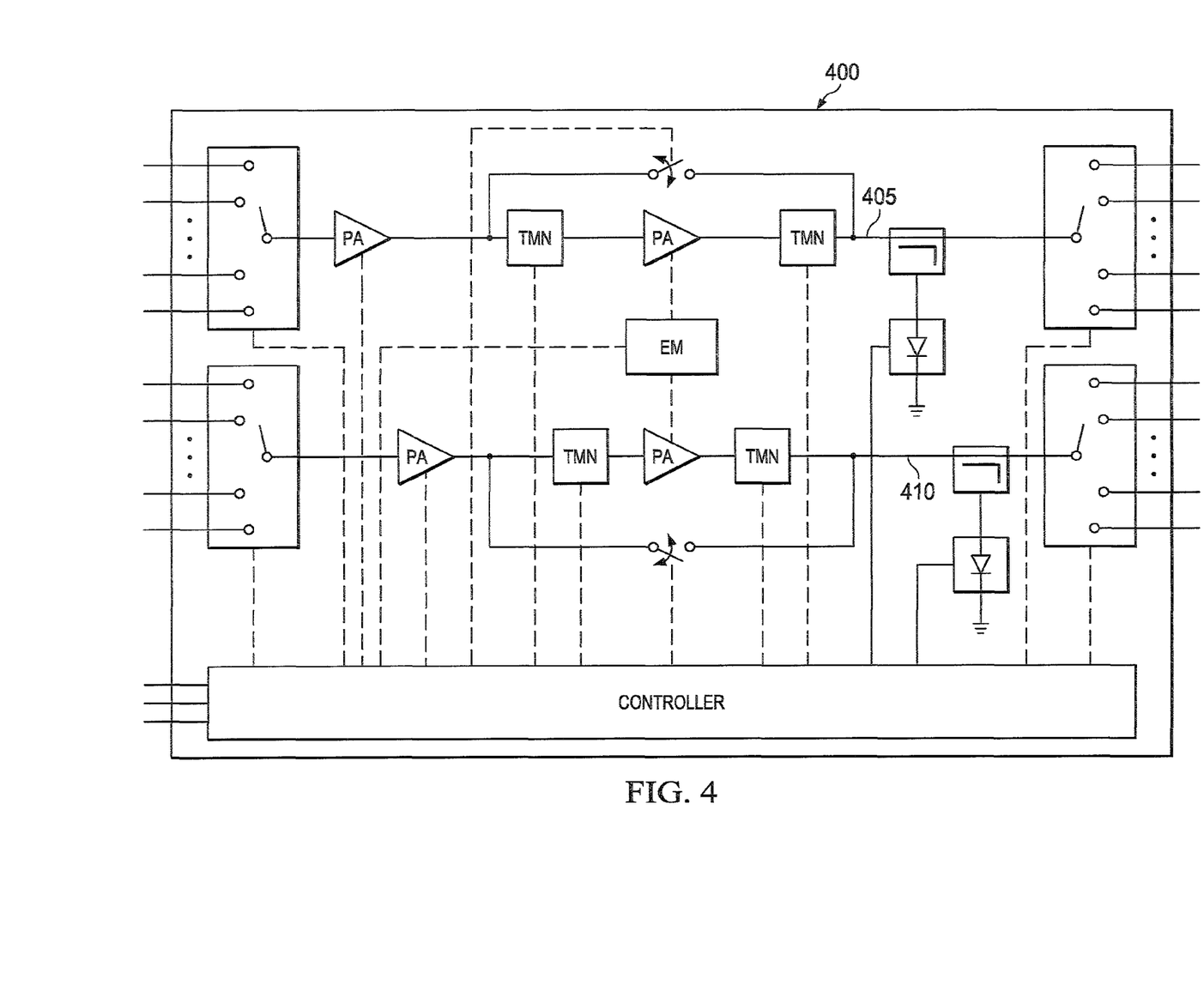
FIG. 4 illustrates an example implementation of a tunable power amplifier module including separate paths for high and low bands according to the present disclosure.

FIG. 4 illustrates an example implementation of a tunable power amplifier module including separate paths for high and low bands according to the present disclosure. In this illustrative embodiment, PA module 400 is an example of one implementation of PA module 200 in FIG. 2 including separate paths for high and low bands.

PA module 400 includes first path 405 and second path 410. For example, first path 405 is for amplifying signals at a low band (e.g. about 700 MHz to about 1000 MHz), while second path 410 is for amplifying signals at a high band (e.g. about 1700 MHz to about 2600 MHz).

Figure 5:
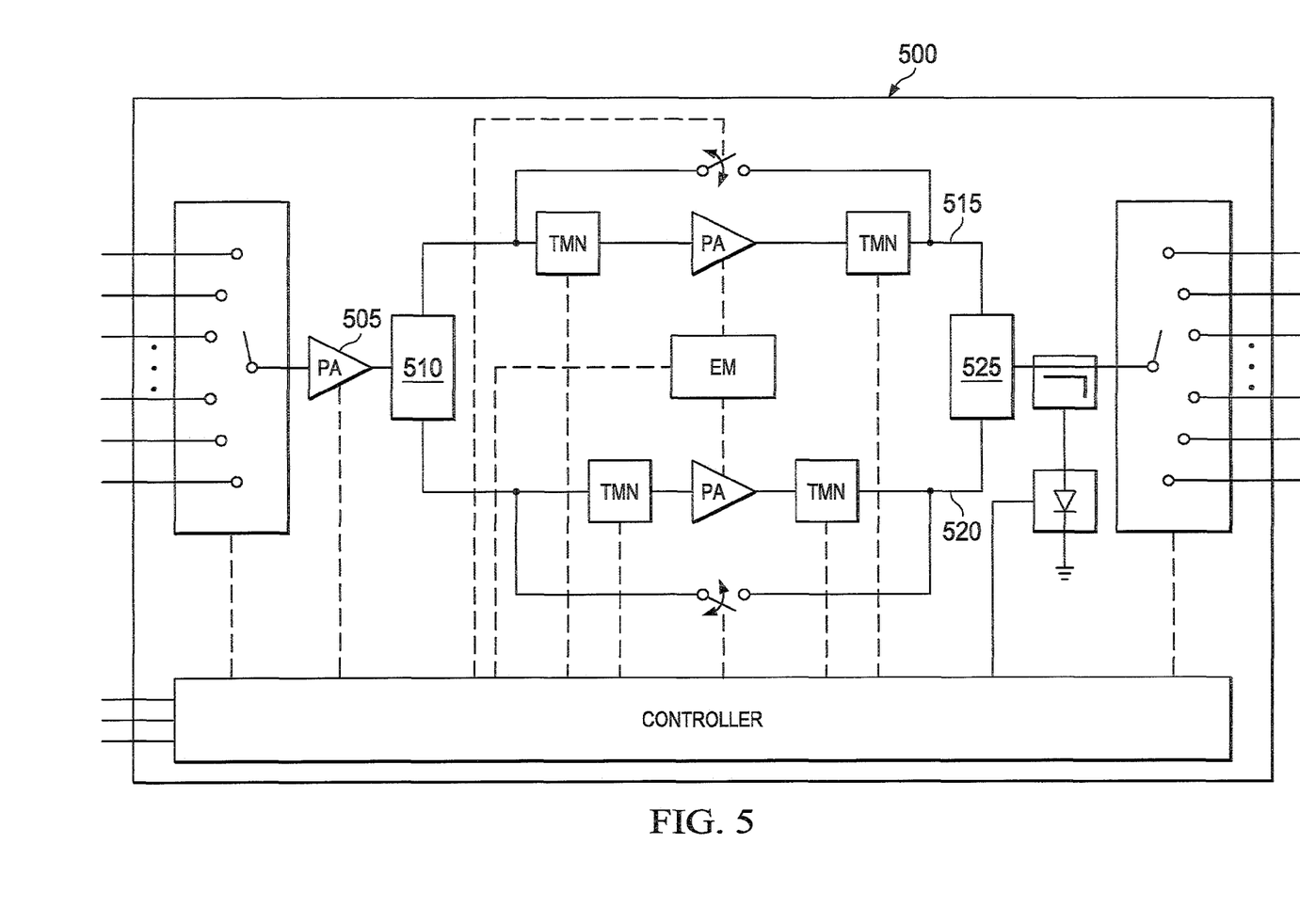
FIG. 5 illustrates another example implementation of a tunable power amplifier module including separate paths for high and low bands according to the present disclosure.

FIG. 5 illustrates another example implementation of a tunable power amplifier module including separate paths for high and low bands according to the present disclosure. In this illustrative embodiment, PA module 500 is an example of one implementation of PA module 200 in FIG. 2 including separate paths for high and low bands. PA module 500 is similar to PA module 400 in FIG. 4. However, PA module 500 includes a single broadband driver (PA 505) and switch 510 for switching high band and lowband signals to one of first path 515 and second path 520. PA module 500 also includes switch 525 for outputting signals from one of first path 515 and second path 520. In these examples, switches 510 and 525 may be a diplexer or single pole double throw (SPDT) switch.

Figure 6:
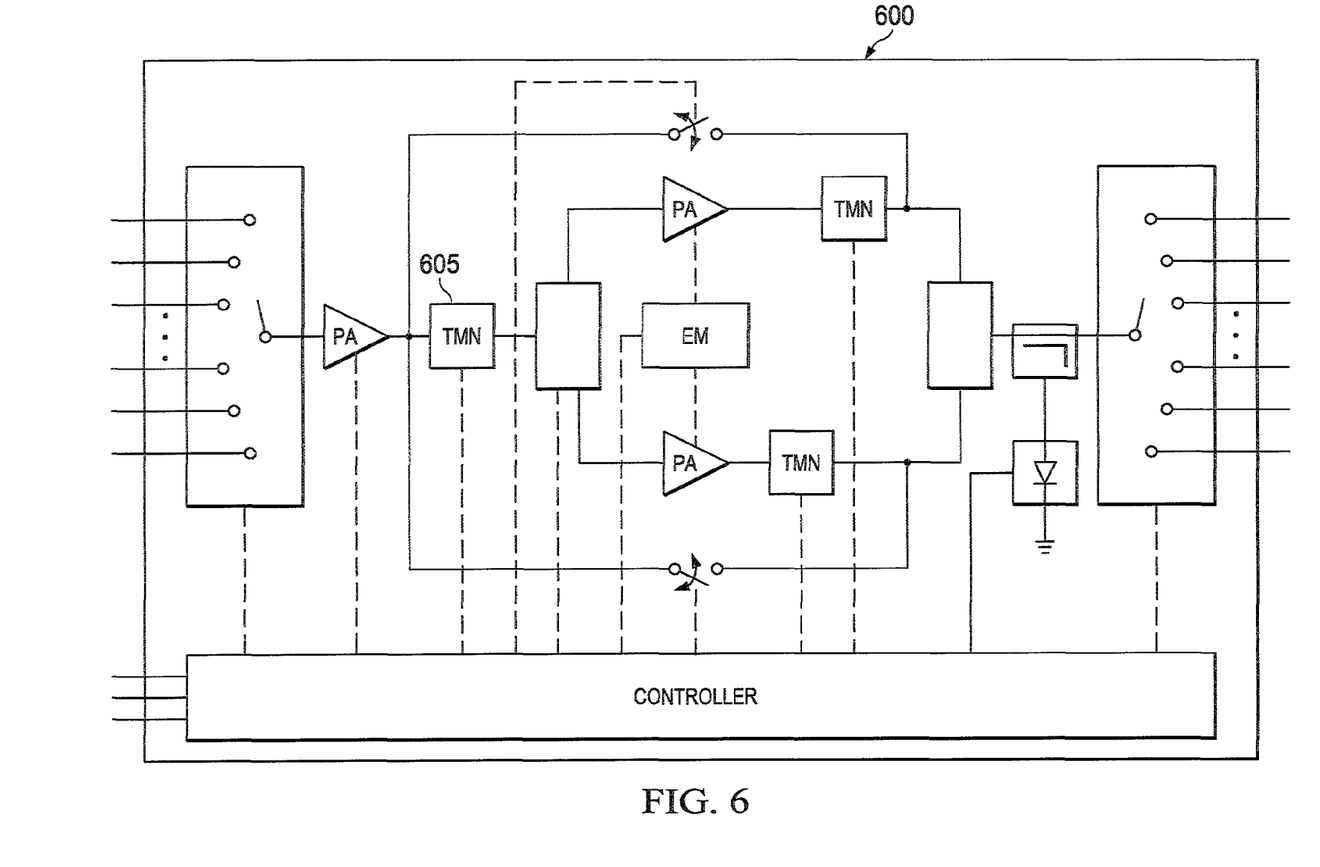
FIG. 6 illustrates yet another example implementation of a tunable power amplifier module including separate paths for high and low bands according to the present disclosure.

FIG. 6 illustrates yet another example implementation of a tunable power amplifier module including separate paths for high and low bands according to the present disclosure. In this illustrative embodiment, PA module 600 is an example of one implementation of PA module 200 in FIG. 2 including separate paths for high and low bands. PA module 600 is similar to PA module 500 in FIG. 5. However, PA module 600 includes a TMN (TMN 605) before the second stage of signal amplification. In this illustrated embodiment, board space may be saved by using the one TMN 605.

Figure 7:
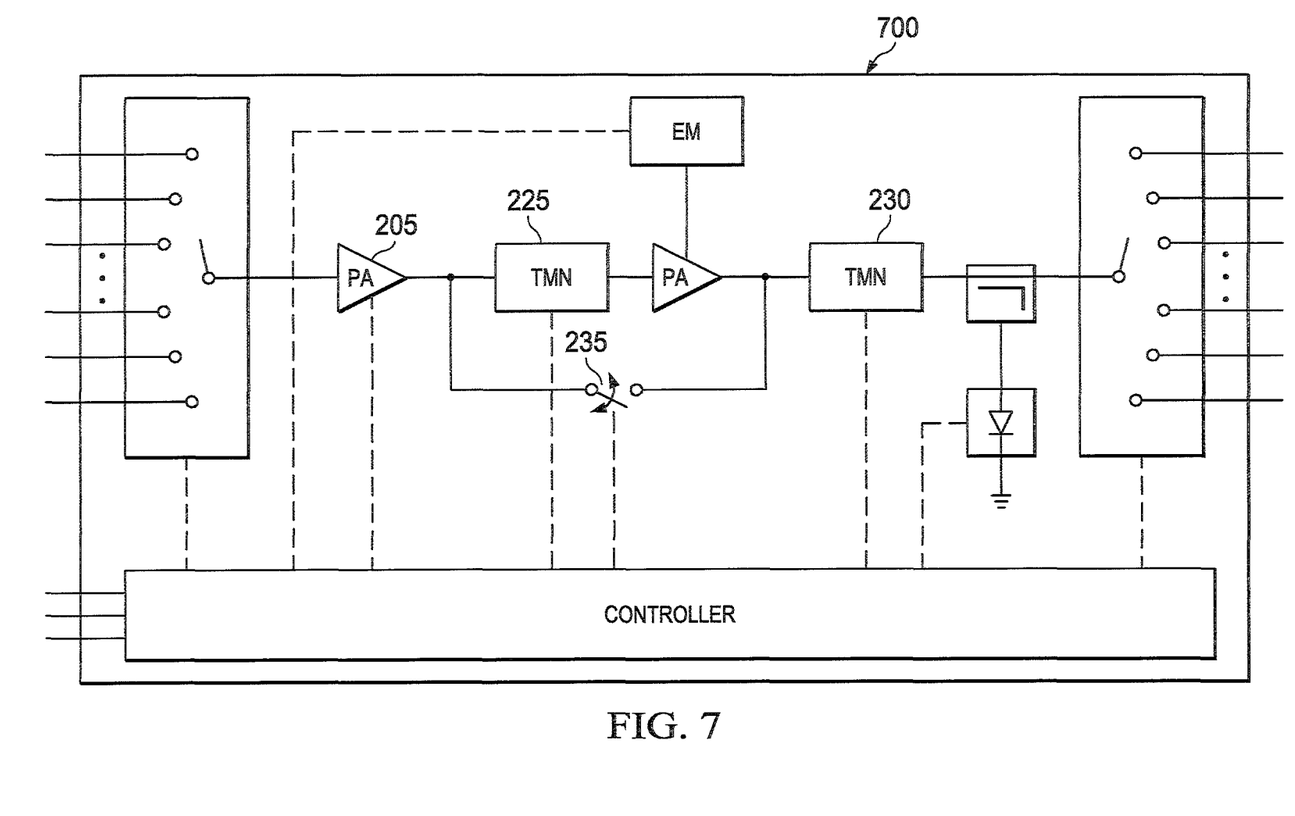
FIG. 7 illustrates example implementation for tunable power amplifier module configured for high and low power according to the present disclosure.

FIG. 7 illustrates an example implementation for tunable power amplifier module configured for high and low power according to the present disclosure. In this illustrative embodiment, PA module 700 is an example of one implementation of PA module 200 in FIG. 2 configured for high and low power. In this illustrative example, bypass switch 235 is positioned on a path between PA 205 and TMN 230. At low power, bypass switch 235 is closed. However, in PA module 700 TMN 230 remains on the path traveled by a signal at a low power setting. In this example, TMN 230 is utilized in PA module 700 to match impedance values a low power when bypass switch 235 is closed. The configuration of bypass switch 235 in FIG. 7 may be applied to any of the embodiments disclosed. For example, PA modules 400, 500, and 600 may include a TMN in the signal path when the bypass switch(es) is/are closed.

Figure 8:
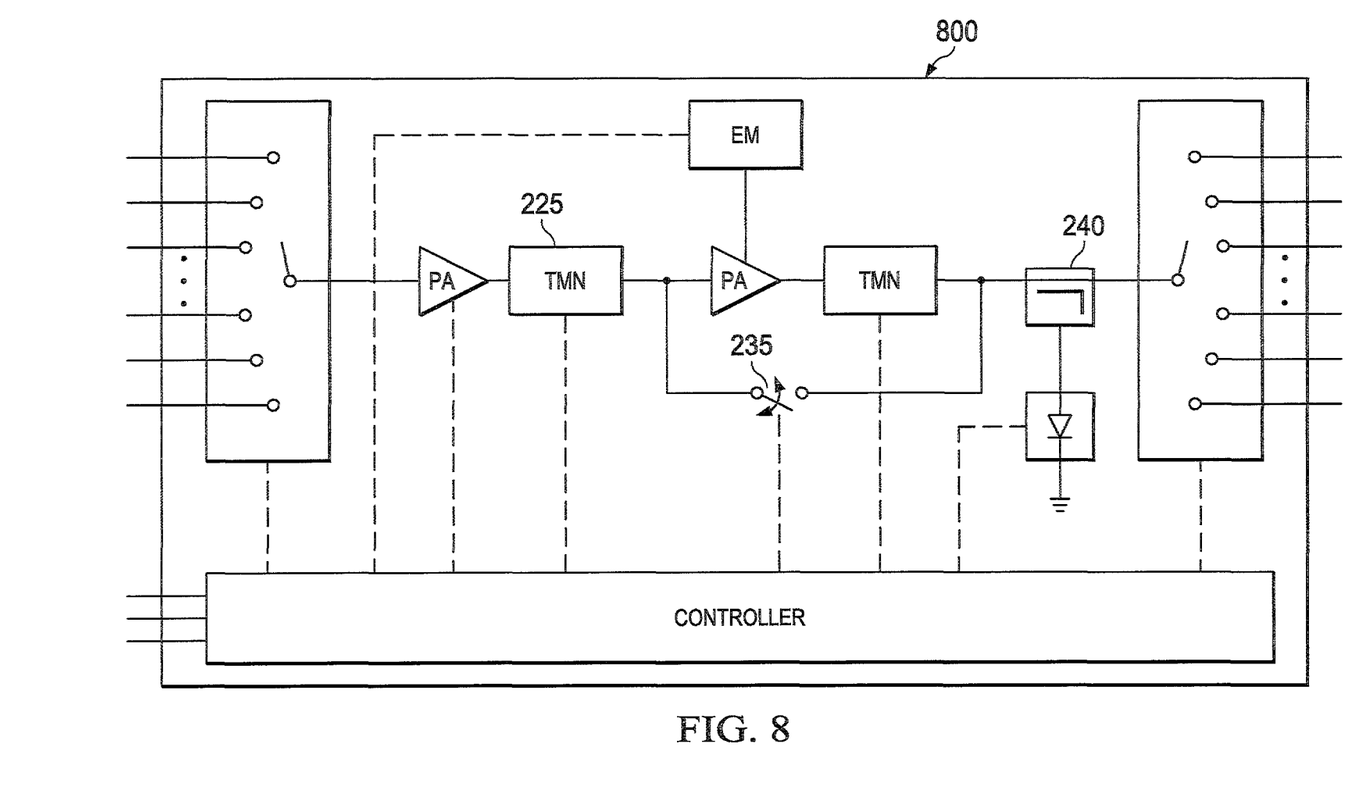
FIG. 8 illustrates another example implementation for tunable power amplifier module configured for high and low power according to the present disclosure.

FIG. 8 illustrates another example implementation for tunable power amplifier module configured for high and low power according to the present disclosure. In this illustrative embodiment, PA module 800 is an example of one implementation of PA module 200 in FIG. 2 configured for high and low power. In this illustrative example, bypass switch 235 is positioned on a path between TMN 225 and sensor 240. At low power, bypass switch 235 is closed. However, in PA module 800 TMN 225 remains on the path traveled by a signal at a low power setting. In this example, TMN 225 is utilized in PA module 800 to match impedance values a low power when bypass switch 235 is closed. The configuration of bypass switch 235 in FIG. 8 may be applied to any of the embodiments disclosed. For example, PA modules 400, 500, and 600 may include a TMN in the signal path when the bypass switch(es) is/are closed.

Figure 9:
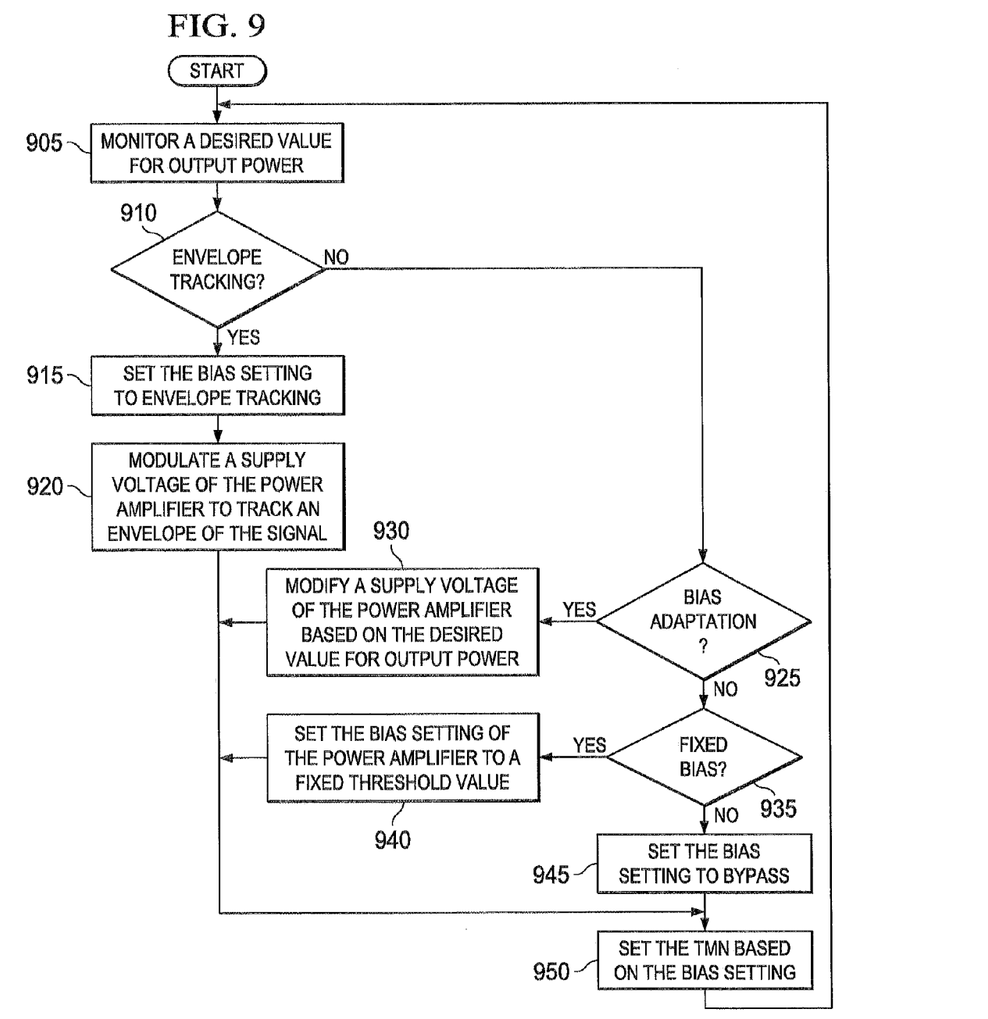
FIG. 9 illustrates a process for tuning a power amplifier module impedance values in a radio in a wireless network according to the present disclosure.

FIG. 9 illustrates a process for tuning a power amplifier module impedance values in a radio in a wireless network according to the present disclosure. The process illustrated in FIG. 9 may be implemented in mobile station 100 by processor 140 in FIG. 1. The process may also be implemented in power amplifier module 200 by controller 215 in FIG. 2.

The process begins by monitoring a desired value for output power (block 905). In block 905, the process may obtain the output power value from a modem of a mobile station. The output power value may be selected to reduce power consumption, potential interference and/or increase signal strength based on proximity to a base station.

The process then determines whether the desired value for output power is within a range of values for envelope tracking (block 910). In block 910, if the output power value is sufficiently high enough, power savings may be realized by envelope tracking. If the process determines that the desired value for output power is within the range of values for envelope tracking, the process sets the bias setting to envelope tracking (block 915). Thereafter, the process modulates a supply voltage of the power amplifier to track an envelope of the signal (block 920). The process then proceeds to block 950, discussed below.

If, however, the process determines that the desired value for output power is not within the range of values for envelope tracking, the process determines whether the desired value for output power is within a range of values for bias adaptation (block 925). In block 925, envelope tracking may not be most efficient given the output power value. If the process determines that the desired value for output power is within the range of values for bias adaptation, the process modifies a supply voltage of the power amplifier based on the desired value for output power (block 930). In block 930, the process continues to monitor the desired value for output power and adjusts the supply voltage to the power amplifier to meet the desired value for output power. Thereafter, the process proceeds to block 950, discussed below.

If, however, the process determines that the desired value for output power is not within the range of values for bias adaptation, the process determines whether the desired value for output power is within a range of values for a fixed bias setting (block 935). In block 935, to meet the desired power level, the power amplifier may have to be maintained at a fixed bias. If the process determines that the desired value for output power is within the range of values for the fixed bias setting, the process sets the bias setting of the power amplifier to the fixed threshold value (block 940). In block 940, the fixed bias setting may be a minimum supply voltage to provide adequate signal gain for the power amplifier. The process then proceeds to block 950, discussed below.

If, however, the process determines that the desired value for output power is not within the range of values for the fixed bias setting, the process sets the bias setting to bypass (block 945). In block 945, the output power is low enough that the second or final driver stage of amplification is not necessary. The final driver stage may be switched out of the signal path. The power amplifier and any switched out TMN(s) may be powered off to save power.

Thereafter, the process sets the TMN based on the bias setting (block 950). In block 950, the TMN(s) is/are set based on the bias setting of the power amplifier. For example, the TMN setting may be retrieved from a look-up table in memory for a given power amplifier bias setting. The process then returns to block 905 and continues to monitor the desired value for output power. For example, the process may detect the desired value for output power passing a threshold from one predefined range of output power values to another predefined range of output power values. When the desired value for output power crosses such a threshold, the process will change the bias and TMN settings based on the changed value for output power.

The present disclosure describes system architecture of PA module which is capable of operating in multiple modes and bands within in mobile station. The present disclosure can reduce multiple PAs to single circuit leading to board cost reduction, board space reduction, and lower manufacturing costs. Additionally, because the PA module is digitally programmable for multiple bands and modulation schemes, the PA module of the present disclosure may be utilized numerous different types of mobile stations models leading to unified platforms and improving manufacturing efficiency. The PA module of the present disclosure also offers improved performance with integrated digitally controlled tunable matching and real-time feedback.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An apparatus for amplifying a signal for use in a wireless network, the apparatus comprising:
   a power amplifier configured to output the signal at an output power;
   an envelope modulator configured to control a bias voltage of the power amplifier;
   a tunable matching network (TMN) including a plurality of immittance elements;
   a controller operably connected the envelope modulator and the TMN, the controller configured to identify a desired value for the output power of the power amplifier, select a bias setting for the power amplifier from a plurality of bias settings based on the desired value for the output power of the power amplifier, control the output power of the power amplifier based on the bias setting of the power amplifier, and set a number of the plurality of immittance elements based on the bias setting of the power amplifier; and a switch operably connected to the controller, the switch, when set, configured to cause the signal to bypass the power amplifier.

2. The apparatus of claim 1, wherein:
the controller is further configured to set, responsive to determining that the desired value is within a range of values for envelope tracking, the bias setting of the power amplifier to envelope tracking mode and set the number of the plurality of immittance elements based on the bias setting being envelope tracking; and
wherein the envelope modulator is further configured to modulate, responsive to the controller determining that the desired value is within the range of values for envelope tracking, a supply voltage of the power amplifier to track an envelope of the signal.

3. The apparatus of claim 1, wherein the controller is further configured to set, responsive to determining that the desired value for the output power of the power amplifier is within a range of values for bias adaptation, a supply voltage of the power amplifier at a constant level based on a target average output power of the power amplifier, and set the number of the plurality of immittance elements based on the supply voltage of the power amplifier being modified.

4. The apparatus of claim 1, wherein the controller is further configured to set, responsive to determining that the desired value is within a range of values for a fixed bias setting, the bias setting of the power amplifier to a fixed threshold value of the power amplifier and set the number of the plurality of immittance elements based on the bias setting being the fixed threshold value and wherein the fixed threshold value of the power amplifier is a minimum voltage value for the power amplifier to maintain an adequate signal gain (transistor in saturation mode).

5. The apparatus of claim 1, wherein the controller is further configured to set, responsive to determining that the desired value is within a range of values for bypass, the switch such that the signal bypasses the power amplifier and set the number of the plurality of immittance elements based on the bias setting being bypass.

6. The apparatus of claim 1 further comprising:
a storage device operably connected to the controller, the storage device configured to store a plurality of settings for the TMN, one setting in the plurality of settings for each of the plurality of bias settings of the power amplifier,
wherein the TMN is configured to modify values for impedance at one of an input and an output of the power amplifier using a setting in the plurality of settings selected based on the bias setting of the power amplifier.

7. The apparatus of claim 1 further comprising:
a storage device configured to store information about the plurality of bias settings of the power amplifier, one bias setting in the plurality of bias settings for each range of values of the output power of the power amplifier.

8. The apparatus of claim 1, wherein the power amplifier is part of a transmitter of a mobile station.

9. The apparatus of claim 1, wherein the power amplifier is part of a transmitter and wherein the controller is further configured to identify the desired value for the output power of the power amplifier based on an operating mode of the transmitter.

10. The apparatus of claim 1, wherein the TMN is a first TMN operably connected to an output of the power amplifier, the apparatus further comprising:
a second TMN operably connected to an input of the power amplifier, wherein the controller is further configured to control a set of performance parameters of the power amplifier by modifying settings of the first TMN and the second TMN based on the bias setting of the power amplifier and wherein the set of performance parameters are selected based on at least one of an efficiency target, a linearity target, a operating frequency for the signal, a bias class of the power amplifier, an output power level, a noise figure, and a gain target.

11. The apparatus of claim 5, wherein the switch is one of:
a semiconductor switch;
a silicon-on-insulator switch;
a silicon-on-sapphire switch;
a high-resistivity substrate switch;
a ferro-electric material switch; and
a micro-electro-mechanical system (MEMS) switch.

12. A method for amplifying a signal for use in a wireless network, the method comprising:
outputting, by a power amplifier, the signal at an output power;
identifying a desired value for the output power of the power amplifier;
selecting a bias setting for the power amplifier from a plurality of bias settings based on the desired value for the output power of the power amplifier;
controlling the output power of the power amplifier based on the bias setting for the power amplifier;
setting a number of a plurality of immittance elements in a tunable matching network (TMN) operably connected the power amplifier based on the bias setting of the power amplifier; and
causing, using a switch, when the switch is set, the signal to bypass the power amplifier.

13. The method of claim 12 further comprising:
responsive to determining that the desired value is within a range of values for envelope tracking mode, setting the bias setting of the power amplifier to envelope tracking, setting the number of the plurality of immittance elements based on the bias setting being envelope tracking, and modulating a supply voltage of the power amplifier to track an envelope of the signal.

14. The method of claim 12 further comprising:
responsive to determining that the desired value for the output power of the power amplifier is within a range of values for bias adaptation, setting a supply voltage at a constant level based on a target average output power of the power amplifier; and
setting the number of the plurality of immittance elements based on the supply voltage of the power amplifier being modified.

15. The method of claim 12 further comprising:
responsive to determining that the desired value is within a range of values for a fixed bias setting, setting the bias setting of the power amplifier to a fixed threshold value of the power amplifier and setting the number of the plurality of immittance elements based on the bias setting being the fixed threshold value, wherein the fixed threshold value of the power amplifier is a minimum voltage value for the power amplifier to maintain an adequate signal gain.

16. The method of claim 12 further comprising:
responsive to determining that the desired value is within a range of values for bypass, setting the switch such that the signal bypasses the power amplifier and setting the number of the: plurality of immittance elements based on the bias setting being bypassed.

17. The method of claim 12 further comprising:
controlling a set of performance parameters of the power amplifier by modifying settings of the TMN based on the bias setting of the power amplifier, wherein the set of performance parameters are selected based on at least one of an efficiency target, a linearity target, a operating frequency for the signal, a bias class of the power amplifier, an output power level, a noise figure, and a gain target.

18. The method of claim 12, wherein the power amplifier is part of a transmitter of a mobile station.

19. A power amplifier module for amplifying a signal in a mobile station, the amplifier module comprising:
a first power amplifier configured to amplify the signal;
a second power amplifier configured to output the signal at an output power;
a first tunable matching network (TMN) operably connected to an output of the first power amplifier and an input of the second power amplifier;
a second TMN operably connected to an output of the second power amplifier;
an envelope modulator configured to control a bias setting for the second power amplifier;
a switch positioned on a path between the input and the output of the second power amplifier;
a storage device configured to store a plurality of bias settings of the second power amplifier and a plurality of settings for the first TMN and the second TMN; and
a controller operably connected to the envelope modulator, the first and second TMNs, the switch, and the storage device, wherein the controller is configured to identify a desired value for the output power of the second power amplifier, identify the bias setting and the settings for the first TMN and the second TMN from the storage device based on the desired value for the output power, control the output power of the second power amplifier by modifying the bias setting, and set a number of immittance elements in the first and second TMN based on the bias setting.

20. The power amplifier module of claim 19, wherein the controller is further configured to:
set the bias setting of the second power amplifier to envelope tracking and signal the envelope modulator to modulate a supply voltage of the second power amplifier to track an envelope of the signal in response to identifying that the desired value for the output power of the second power amplifier is within a range of values for envelope tracking;
set the supply voltage of the second power amplifier at a constant level based on the target average output power of the second power amplifier in response to identifying that the desired value for the output power of the second power amplifier is within a range of values for bias adaptation;
set the bias setting of the second power amplifier to a fixed threshold value of the second power amplifier in response to identifying that the desired value for the output power of the second power amplifier is within a range of values for a fixed bias setting, wherein the fixed threshold value of the second power amplifier is a minimum voltage value for the second power amplifier to maintain an adequate signal gain; and
set the switch such that the signal bypasses the second power amplifier in response to identifying that the desired value for the output power of the second power amplifier is within a range of values for bypass.

* * * * *